Jan. 13, 1959 R. E. DE COLA 2,869,041

MOUNTING MEANS

Filed Nov. 8, 1956 2 Sheets-Sheet 1

INVENTOR.
Rinaldo E. De Cola

BY Donald W. Phillion

HIS ATTORNEY

Jan. 13, 1959 R. E. DE COLA 2,869,041

MOUNTING MEANS

Filed Nov. 8, 1956 2 Sheets-Sheet 2

INVENTOR.
Rinaldo E. De Cola
BY Donald W. Phillion
HIS ATTORNEY

2,869,041

MOUNTING MEANS

Rinaldo E. De Cola, Park Ridge, Ill., assignor to Admiral Corporation, Chicago, Ill., a corporation of Delaware Application November 8, 1956, Serial No. 621,083

6 Claims. (Cl. 317—101)

This invention relates, generally, to printed circuit boards, and more specifically to means for mounting circuit components on a printed wiring board.

In recent years much has been done to eliminate the maze of connecting leads that has been so common in electronic equipment. Such elimination of connecting leads has been accomplished largely by the development of printed wiring boards (also known as printed circuits) which consist, generally, of an insulative board having conductive paths formed on the surface thereof. Little has been done, however, to eliminate the terminal leads of circuit components. Such terminal leads can often give rise to certain problems, such as, for example, the creation of undesirable inductance or capacitance in the circuit in which they are used. Further, in the manufacturing of electronic equipment using printed wiring boards and circuit components having terminal leads, special equipment is needed for crimping, pointing, trimming, and clinching the terminal leads of the circuit components to the underside of the wiring board.

With respect to some circuit components, such as capacitors, for example, the above-mentioned difficulties substantially have been solved. Generally, the capacitors employed are comprised of a flat-shaped dielectric having an exposed metallic coating on either side thereof. This capacitor is inserted into a slot formed through the printed circuit board. The printed circuit board is then dip-soldered to bond the exposed metallic coatings of the capacitor to the printed conductors which lead up to the slot. This bond acts both to structurally support the capacitor and also to provide a good electrical contact between the printed conductors and the capacitor. However, such a bond is rigid and brittle and will often break when a strain is placed upon the board.

It is an object of the present invention to provide a stronger and more flexible structure for mounting leadless circuit components upon a printed wiring board.

Another object of the invention is to provide a more reliable means than has been known heretofore for mounting leadless circuit components on a printed wiring board.

A third aim of the invention is the improvement of means for mounting circuit elements on printed wiring boards, generally.

In accordance with the invention, there is provided a first conductive support means and a second conductive support means, each having one end securely fastened in the printed wiring board and in contact with a conductor formed on the board. The other ends of the conductive support means are extended towards each other. The circuit element to be mounted is positioned between said extended portions. Appropriate means such as solder joints are employed to secure the said extended portions to said circuit element. The conductive support means are constructed to have a certain amount of flexibility so that if strains are placed upon the printed wiring board the solder joints will not be apt to break.

In accordance with a specific form of the invention, there are three parallel slots formed through the printed circuit board and positioned side by side. A first conductive support means comprised of a strip of conductive material is folded partially around the portion of the board between a first end slot and the middle slot so as to make contact with a printed conductor, and a second conductive support means also comprised of a strip of conductive material is folded partially around the portion of the board between the other end slot and the middle slot so as to make contact with a printed conductor. Each of said conductive support means has a portion which extends towards a plane which passes through the longitudinal center line of the center slot perpendicularly to the printed circuit board. This plane is referred to herein also as the center plane of the center slot. Means such as solder joints are employed to hold the circuit element being mounted securely between these extended portions, and in the center slot. The conductive support means are constructed to have sufficient "give" so that the solder joints will not break when strains are placed upon the printed wiring board.

In accordance with another form of the invention, the printed wiring board has at least one slot with printed conductors leading up to the edge of both sides of the slot, which is wider than the circuit element to be mounted. The circuit element is positioned in the slot and abutting one side of the slot. The metallic coated surface on the abutting side of the circuit element is soldered directly to the printed conductor leading thereto. On the other side of the circuit element a flexible conductive support means is soldered at one end to the other metallic coating on the circuit element and at the other end is soldered to the printed conductor leading up to the edge of the slot.

These and other objects and features of the invention will be more fully understood from the following detailed description thereof when read in conjunction with the drawings, in which.

Figures 1, 2:
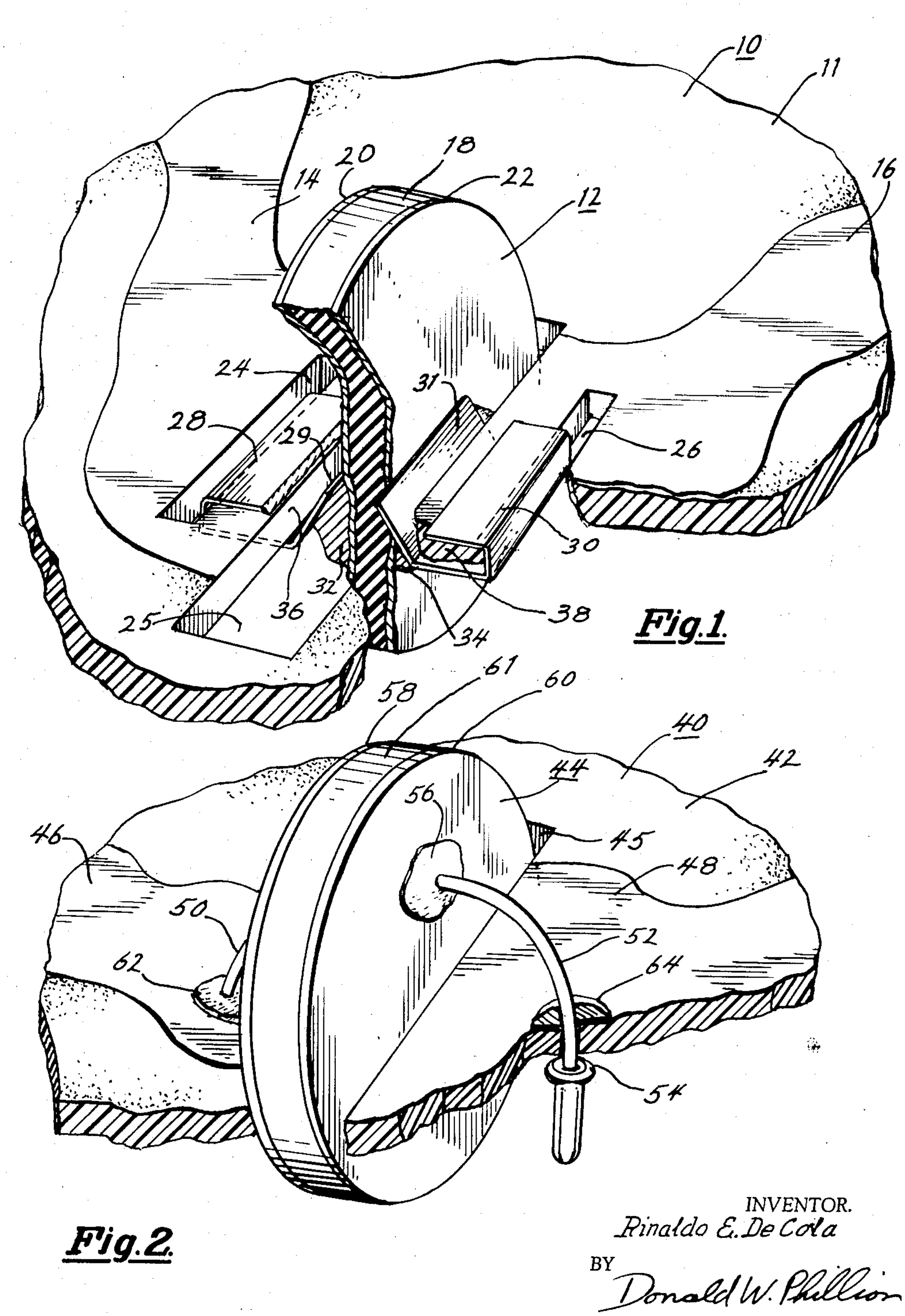
Fig. 1 shows a perspective view of one form of the invention.
Fig. 2 shows a perspective view of another form of the invention.

In Fig. 1 there is shown an enlarged view of a small section of a printed wiring board 10, which is comprised of an insulative base 11 having conductors printed thereon, such as conductors 14 and 16, and having apertures 24, 25, and 26 formed therein. It will be observed that the printed conductor 14 extends around the aperture 24 to cover the portion 36 of the board 11 between the end aperture 24 and the middle aperture 25, and that the printed conductor 16 extends around the aperture 26 to cover the portion 38 of the board 11 between the end aperture 26 and the middle aperture 25. Thus when the clips 28 and 30 are wrapped around the portions 36 and 38 of the board 11, contact will be made with the conductors 14 and 16, respectively. Each of the clips 28 and 30 has a portion 29 and 31, respectively, which extends towards the longitudinal center plane of the center slot 25. Positioned between these extending portions 29 and 31 is the circuit element 12 to be mounted, which in this case is a capacitor. The capacitor 12 is comprised of a flat shaped insulative disc 18 coated on either side with metallic coatings 20 and 22.

The extending portions 29 and 31 are secured to the metallic coatings of the capacitor 12 by means of solder joints 32 and 34 which not only function as structure for supporting the capacitor 18, but also function to provide a good electrical contact between the clips 28 and 30 and the metallic surfaces 20 and 22, respectively, of the capacitor 12. It is to be noted that the extended portions 29 and 31 are sufficiently flexible so that if strain is placed upon the printed wiring board the portions 29 and 31 will "give" and the solder joints will not be likely to break.

As indicated hereinbefore, the type circuit element which can be mounted by means of the clip means 28 and 30 is not limited to capacitors, or to flat-shaped circuit elements. In general, any type circuit element which has terminals comprised of metallic coated areas thereon can be mounted advantageously between clips such as clips 28 and 30.

Referring now to Fig. 2, there is shown another form of the invention. The printed wiring board 40 is comprised of an insulative board 42 having conductors such as conductors 46 and 48 formed on the surface thereof. The elements 50 and 52, which are comprised of a conductive material and are similar in shape, are positioned through apertures provided therefore in the board 40. Flanges, such as flange 54 on element 52, are provided to act as stops and determine the length of the element 52 which shall extend through the board 40. Further, flanges such as flange 54 facilitate insertion of the elements such as elements 50 and 52 into the board by autmatic equipment. Solder joints 62 and 64 function to secure the elements 50 and 52 in the board 40 and to insure a good permanent electrical contact between the conductors 46 and 48 and the elements 50 and 52, respectively.

As can be seen from the sketch of Fig. 2, the portions of the elements 50 and 52 extending through the conductor bearing side of the board 40 are inclined towards each other to form a gap therebetween over the slot 45. Positioned in this gap and inserted in the slot 45 is a capacitor 44 which is comprised of a flat shaped insulative element 61 having conductive metallic coatings 58 and 60 on either side thereof. As in the case of the circuit shown in Fig. 1, circuit elements other than capacitors may be mounted by the structure shown in Fig. 2. The capacitor 44 is secured to the somewhat flexible elements 50 and 52 by some convenient means, such as, for example, the solder joint 56, which secures the element 52 to the capacitor. Further, such solder joints function to provide a good permanent electrical contact between the metallic coating 60 and the element 52.

Figure 3:
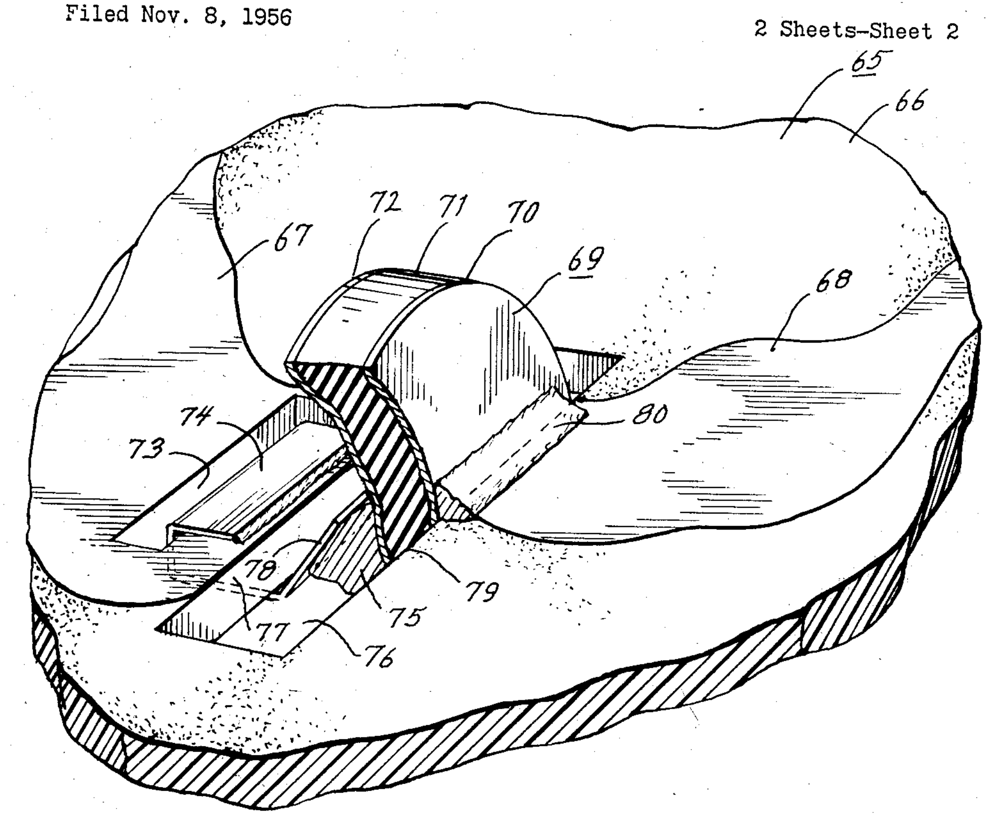
Fig. 3 shows a perspective view of a third form of the invention.

Referring now to Fig. 3, there is shown a form of the invention wherein a resilient supporting member 74 is employed on one side only of the circuit element 69 to be mounted. The other side of the circuit element to be mounted is connected directly to a printed conductor 68.

More specifically, there is provided a printed wiring board 65 comprised of an insulative board 66 having conductors such as conductors 67 and 68 formed on the surface thereof and having apertures 73 and 76 formed therethrough. The clip 74 is folded around the portion 77 of the printed circuit board between the aperture 73 and the aperture 76, so as to contact conductor 67. The element 69, which is a capacitor comprised of flat-shaped insulative element 71 having metallic coatings 72 and 70 on either side thereof, is positioned between the extending portion 78 of the clip 74 and the edge 79 of the aperture 76. Solder joint 75 secures the extended portion 78 of the clip 74 to the metallic coating 72 of the capacitor 69. The solder joint 80 secures the conductor 68 to the metallic coating 70 of the capacitor 69. Both solder joints provide structural support for the capacitor, as well as forming good electrical connections between the elements they connect. The extended portion 78 of the clip 74 is constructed to have sufficient flexibility so that if strain is placed on the printed wiring board the solder joints will not be likely to break.

It is to be specifically noted that the structures shown herein can be employed to mount circuit elements of many different shapes of which a flat shape is but one.

It is to be understood that the forms of the invention herein shown and described are but preferred embodiments of the same and that various changes may be made in the shape and arrangement of the conductive support means without departing from the spirit or scope of the invention.

I claim:

1. Means for mounting an element on a printed wiring board having at least one aperture therein, said element having terminals comprised of metallic areas coated thereon, first conductive flexible supporting means having a first end securely mounted in the board near one side of said aperture and having the other end thereof extend generally towards the normal projection of the center of said aperture, second conductive supporting means having a first end mounted securely in the board near the other side of said aperture and having the other end thereof extend generally towards the normal projection of the center of said aperture, said element being positioned in said aperture and between said extending ends of said conductive supporting means, and metallic joints between each of the extending ends of said conductive supporting means and a metallic area of said element.

2. Means for mounting, on a printed wiring board having three substantially parallel slots therethrough and arranged substantially side by side, an element having as terminals metallic coated areas thereon, said means comprising first clip means partially folded around a first portion of the printed wiring board between a first end slot and the middle slot, second clip means partially folded around a second portion of the printed wiring board between the second end slot and the middle slot, each of said clip means having a portion which extends, one towards the other, between the said first and second portions of said printed wiring board, the said element being held between said extending portions, and means for forming a metallic seal between each of said clip means and a conductor printed on said board and between each of said clip means and a metallic coated area of said element.

3. Means for mounting an element on a printed wiring board having three slots formed therethrough and arranged side by side and substantially parallel with each other, said printed wiring board having conductors formed on the surface thereof which cover at least a part of the two portions of the printed wiring board between the end slots and the center slot, said means comprising first clip means partially folded around one of said portions of the printed wiring board in such a manner as to contact a conductor formed on the printed wiring board, second clip means partially folded around the other of said portions of the printed wiring board in such a manner as to contact another conductor formed on the printed wiring board, each of said clip means comprised of a conductive material and having a portion which extends toward the center plane of the center slot, means for holding said element in said center slot and between the extending portions of said clip means, and means for securing said clip means to said printed wiring board.

4. Means for mounting an element on a printed wiring board in accordance with claim 3, in which said element comprises terminals consisting of metallic coated areas and in which said means for holding said element between the extended portions of said clip means comprise solder type joints each of which electrically connects one of said extended portions to one of said metallic coated areas.

5. In combination with a printed wiring board comprised of an insulative board having conductors formed on the surface thereof and having formed therethrough three slots which are arranged side by side and substantially parallel with each other, the conductors being arranged to extend over the portions of said printed wiring board between the center slot and the end slots, a circuit element having terminals comprised of metallic areas coated thereon, and means for mounting said circuit element, said means comprising first clip means partially folded around one of said portions of the printed wiring board in such a manner as to contact the conductor formed on the enfolded portion, second clip means partially folded around the other of said portions of the printed wiring board in such a manner as to contact another conductor formed on the enfolded portion, each of said clip means being of a conductive material and having a flexible portion extending towards the center plane of the center slot, means for holding said circuit element in said center slot and between the extending portions of said clip means, and means for securing said clip means to said printed wiring board.

6. Means for mounting an element on a printed wiring board having two slots therethrough arranged side by side and substantially parallel with each other, a first printed conductor extending over the portion of the printed wiring board between said two slots, a second printed conductor approaching the outside edge of a first of said slots, said element being positioned in said first slot and having terminals comprised of metallic areas thereon, conductive means for connecting said second printed conductor to a first metallic area on said element, and conductive support means for connecting said first printed conductor to a second metallic area on said element, said conductive support means comprising a clip partially folded around the portion of said printed wiring board between said slots so as to contact said first printed conductor and having a flexible portion extend towards said element, and conductive means for securing said extending portion of said clip to said second metallic area on said element.

References Cited in the file of this patent

UNITED STATES PATENTS

| | | |
|---|---|---|
| 2,440,308 | Storck | Apr. 27, 1948 |
| 2,542,651 | Franklin | Feb. 20, 1951 |
| 2,607,821 | Arsdell | Aug. 19, 1952 |